April 8, 1958 R. J. HOWELL ET AL 2,830,176

FREQUENCY MODULATION

Filed Dec. 1, 1953

INVENTORS
ROBERT J. HOWELL
CYRIL E. McCLELLAN
HENRY A. MUSK
BY
F.W.R. Heintzen
ATTORNEYS United States Patent Office 2,830,176

Patented Apr. 8, 1958

2,830,176

FREQUENCY MODULATION

Robert J. Howell, Cyril E. McClellan, and Henry A. Musk, Glen Burnie, Md., assignors, by mesne assignments, to the United States of America as represented by the Secretary of the Navy Application December 1, 1953, Serial No. 395,636

3 Claims. (Cl. 250—17)

This invention relates to frequency modulation apparatus, and more particularly to apparatus for frequency modulating a radio frequency signal, which apparatus comprises a frequency controlled oscillator for stability and means for varying the tuning of a circuit for modulation.

There are two basic systems for obtaining a frequency modulated signal. One system utilizes a variable reactance element which is coupled to the frequency determining network of a free running oscillator and which is varied by the intelligence to be transmitted. The second system utilizes a variable reactance element which is coupled to a tuned circuit of a crystal controlled oscillator and which is varied by the intelligence to be transmitted. In the second system, the modulation is more phase modulation than frequency modulation since the frequency shift is usually less than one cycle.

There are disadvantages to both the above-mentioned systems for obtaining frequency modulated signals. In the first system, the frequency of the oscillator may be varied by a substantial amount and high percentage modulation may be obtained, but the center frequency of the free running oscillator is not positively controlled and the oscillator is free to drift. Since many methods of demodulation require a constant center frequency, difficulties arise in the use of the first system.

In the second of the above-mentioned systems for obtaining a frequency modulated signal, the center frequency of the oscillator is positively controlled by the crystal, and the oscillator does not drift, but the frequency of a crystal controlled oscillator can be changed but a small amount or the oscillator ceases oscillation. Therefore, although the center frequency does not vary, the percentage modulation is exceedingly small, and many frequency multiplying stages are required to increase the extent of the frequency shifts caused by the intelligence to be transmitted.

It is an object of this invention to provide a new and improved frequency modulation apparatus.

Another object of this invention is to provide novel frequency modulation apparatus which utilizes a frequency controlled oscillator for center frequency stability and large frequency deviation for high percentage signal modulation.

Other objects and advantages of the invention will hereinafter become more fully apparent from the following description of the annexed drawings, which illustrate a preferred embodiment, and wherein.

Figure 1:
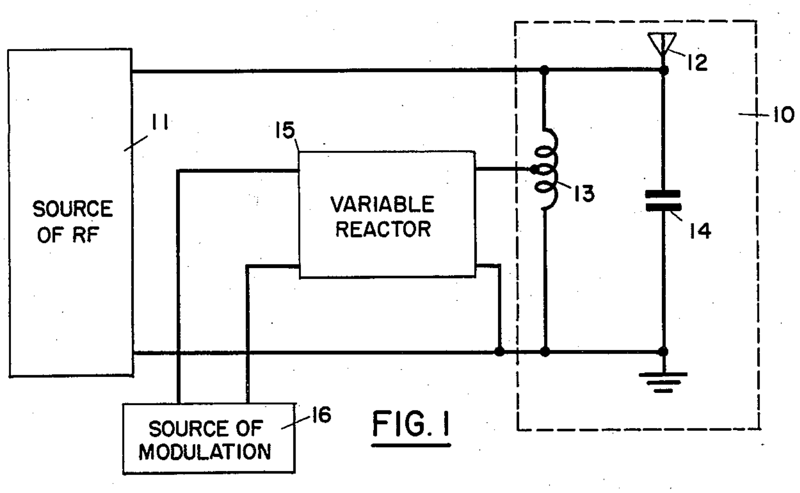
Fig. 1 is a circuit diagram of the basic form of the invention.

Referring now to the drawings, and more particularly to Fig. 1, the reference numeral 11 designates a source of radio frequency energy connected to energize an antenna circuit 10 comprising an antenna 12 and a loading coil 13, which coil tunes a capacitor 14 representing the capacitance of the antenna circuit 10. A variable reactor 15, shown in block form, which variable reactor may comprise any of the well-known variable reactance devices is connected across a portion of the loading coil 13. A source of modulation 16 is connected to the variable reactor 15 to control the reactance thereof.

In the operation of the circuit of Fig. 1, the antenna circuit 10 is tuned to the frequency of the source 11. The source 11 is a constant frequency source such as a crystal controlled oscillator or other generator which does not drift. The resistance of the antenna circuit 10 is kept to a minimum to provide a very high Q circuit in which the circulating currents are much greater than the current supplied by the source 11. It has been found that if the frequency of the currents circulating in the antenna circuit 10 can be controlled, the frequency of the signal radiated by the antenna 12 is also controlled. By instantaneously varying the frequency at which the antenna circuit 10 is tuned, the instantaneous frequency at which the circulating currents oscillate is varied.

The variable reactor 15 is connected across a portion of the loading coil 13 to control the inductance of the loading coil 13, and is, in turn, under the control of the source of modulation 16 to vary in accordance with the signal output therefrom. Therefore, as the output current of the source of modulation 16 varies, the tuning of the antenna circuit 10 also varies and the frequency of the circulating currents in the antenna circuit 10 varies, effectively frequency modulating the energy from the source 11.

Figure 2:
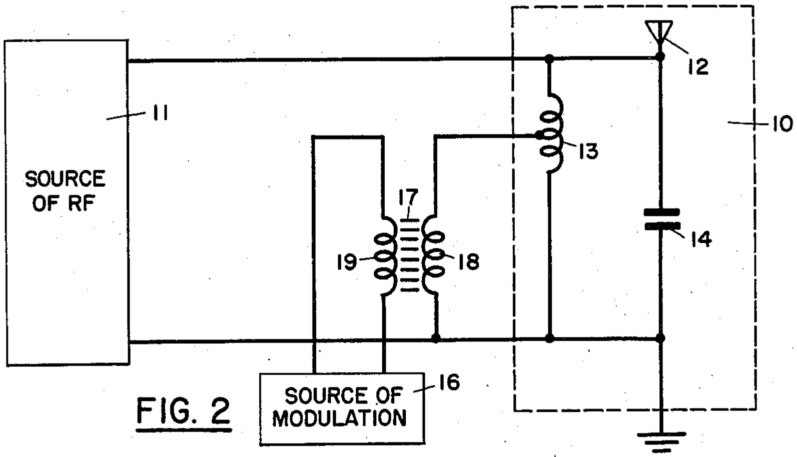
Fig. 2 is a circuit diagram of a specific embodiment of the device of Fig. 1.

A specific embodiment of the device of Fig. 1 is shown in Fig. 2 in which the source of radio frequency energy 11, which is a constant frequency source such as a crystal controlled oscillator, is connected to energize the antenna circuit 10. The capacitance of the antenna circuit 10, represented by the capacitor 14, is tuned by the loading coil 13 to the frequency of the source 11. A secondary winding 18 of a saturable reactor 17 is connected in parallel with a portion of the loading coil 13. A primary winding 19 of the saturable reactor 17 is connected to the source of modulation 16.

In operation, the source of radio frequency energy 11 feeds energy to the antenna circuit 10 to be radiated by the antenna 12. The energy radiated by the antenna 12 is the same as the energy of the source 11 as long as the antenna circuit 10 is tuned to the frequency of the source 11. However, the saturable reactor 17, having its secondary connected across at least a portion of the loading coil 13, determines the inductance and the tuning of the antenna circuit 10. As the amplitude and frequency of the signals from the source of modulation 16 vary through the primary winding 19 of the saturable reactor 17, the inductance of the reactor 17 is varied, and the tuning of the antenna circuit 10 is also varied, resulting in the radiation from the antenna 12 of signals which vary in frequency in accordance with the variations in amplitude of the intelligence from the source of modulation 16.

Figure 3:
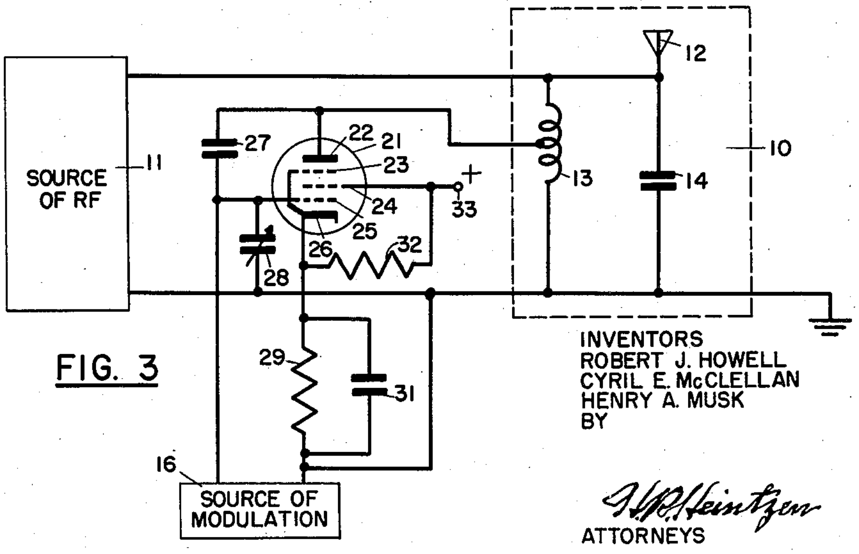
Fig. 3 is a circuit diagram of a second specific embodiment of the device of Fig. 1.

Fig. 3 shows a second embodiment of the basic device shown in Fig. 1 and in which the source of radio frequency energy 11, which is a source of constant frequency energy such as a crystal controlled oscillator, is connected to energize the antenna 12. The loading coil 13 tunes the antenna circuit capacitance, represented by the capacitor 14, to the frequency of the source 11. A pentode 21 having an anode 22, a suppressor grid 23, a screen grid 24, a control grid 25 and a cathode 26 is connected as a reactance tube. The anode 22 is connected to a point intermediate the ends of the loading coil 13, and the control grid 25 is connected through a capacitor 27 to the anode 22 and the loading coil 13. A small variable capacitor 28 is connected between the control grid 25 and ground as a trimmer, and the cathode 26 is connected to ground through a cathode resistor 29 which is paralleled by a cathode by-pass capacitor 31. The source of modulation 16 is connected across the control grid 25 and ground, and the screen grid 24 is connected to a positive high voltage terminal 33 and to the cathode 26 through a resistor 32.

In operation, the source of radio frequency energy 11 feeds the antenna circuit 10 with radio frequency energy which is transmitted by the antenna 12. The reactance tube circuit is connected across at least a portion of the loading coil 13 and controls the inductance thereof. The connection of the loading coil 13 to the control grid 25 through the capacitor 27 and directly to the anode 22, results in a 90° phase shift between the voltage applied to the control grid 25 and the voltage applied to the anode 22 by the loading coil 13. Because the anode 22 and the control grid 25 are fed in quadrature, the tube 21 represents a reactance. The current flow, and therefore the voltage, in the circuit of the anode 22 can be controlled by the bias applied to the tube 21. This bias is in part fixed by the cathode resistor 29 and its parallel capacitor 31.

The source of modulation 16 applies a signal voltage to the control grid 25 and to the cathode 26 through the resistor 29, which signal voltage varies the bias on the tube 21. As the amplitude of the signal from the source 16 varies, the conduction through the tube 21 varies, and the current flow through the circuit of the anode 22 varies. The changes in the voltage of the anode which result from the changes in the voltage of the control grid 25 caused by the signal voltage from the source of modulation 16 are 180° out of phase with the corresponding voltage changes of the control grid 25. The phase difference between the resultant voltage of the control grid 25 and the resultant voltage of the anode 22 varies with the value of the signal voltage from the source 16, and the reactance of the tube 21 is varied, changing the tuning of the antenna circuit correspondingly to frequency modulate the circulating currents in the antenna circuit 10 and the energy radiated by the antenna 12.

Other variable reactance devices which are in the contemplation of this invention are magnetostrictive devices for use in circuits where the modulation signal is of comparatively low frequency, condenser microphones for use in circuits where the modulation signal is of comparatively low amplitude, and vibrating members which are vibrated by mechanical means for use in circuits where the modulation signals are of a constant frequency such as those used in facsimile or Teletype.

Obviously many modifications and variations of the present invention are possible in the light of the above teachings. It is therefore to be understood that within the scope of the appended claims the invention may be practiced otherwise than as specifically described.

What is claimed is:

1. Apparatus for frequency modulating alternating electrical energy, said apparatus comprising a source of constant frequency alternating electrical energy, an antenna circuit connected to be energized by said source, said antenna circuit comprising an inductor having substantially pure inductance and an antenna having substantially pure capacitance, said inductor being of a value sufficient to tune the capacitance of said antenna to the frequency of said source, whereby the current circulating in the antenna circuit is much greater than the energizing current, a variable reactance device connected across a portion of said inductor for varying the resonant frequency of the antenna circuit, and a source of modulation signals connected to said reactance device to control the reactance thereof, whereby the resonant frequency of the antenna circuit is modulated to cause a corresponding variation in the instantaneous frequency at which the circulating current oscillates.

2. The apparatus defined in claim 1 wherein said variable reactance device is a saturable reactor having a primary winding and a secondary winding, said primary winding being connected to said source of modulating signals to be controlled thereby, said secondary winding being connected across a portion of said inductor to control the reactance thereof.

3. The apparatus defined in claim 1 wherein said variable reactance device comprises a reactance tube having an anode and a control grid, said anode being connected to said inductor and energized thereby, said control grid being energized by said inductor in quadrature with said anode, said control grid being connected to said source of modulating signals to be energized therefrom to control the reactance of said reactance tube.

References Cited in the file of this patent

UNITED STATES PATENTS

| | | |
|---|---|---|
| 1,684,235 | Love | Sept. 11, 1928 |
| 2,288,575 | Stablein | June 30, 1942 |
| 2,382,615 | Donley | Aug. 14, 1945 |
| 2,539,594 | Rines et al. | Jan. 30, 1951 |
| 2,541,650 | Hepp | Feb. 13, 1951 |
| 2,563,964 | Schlang | Aug. 14, 1951 |
| 2,659,866 | Landon | Nov. 17, 1953 |